United States Patent
Nguyen

(10) Patent No.: US 7,451,957 B2
(45) Date of Patent: Nov. 18, 2008

(54) RUGGED CABLE MANAGEMENT SYSTEM

(75) Inventor: Bao Nguyen, Garden Grove, CA (US)

(73) Assignee: Jonathan Engineered Solutions, Irvine, CA (US)

( * ) Notice: Subject to any disclaimer, the term of this patent is extended or adjusted under 35 U.S.C. 154(b) by 114 days.

(21) Appl. No.: 11/386,030

(22) Filed: Mar. 20, 2006

(65) Prior Publication Data

US 2007/0045479 A1 Mar. 1, 2007

Related U.S. Application Data

(60) Provisional application No. 60/663,488, filed on Mar. 18, 2005.

(51) Int. Cl.
  *H01B 7/06* (2006.01)
  *H02B 1/20* (2006.01)
(52) U.S. Cl. .................. 248/282.1; 211/26; 361/826; 174/69; 312/265.1
(58) Field of Classification Search .......... 248/49, 248/282.1; 174/69, DIG. 9; 361/727, 826, 361/725, 827; 312/265.1, 265.4, 273
See application file for complete search history.

(56) References Cited

U.S. PATENT DOCUMENTS

| | | | |
|---|---|---|---|
| 5,571,256 A * | 11/1996 | Good et al. .................... 211/26 |
| 6,070,742 A * | 6/2000 | McAnally et al. ............. 211/26 |
| 6,305,556 B1 * | 10/2001 | Mayer .......................... 211/26 |
| 6,326,547 B1 * | 12/2001 | Saxby et al. .................. 174/69 |
| 6,486,399 B1 * | 11/2002 | Armstrong et al. ............ 174/58 |
| 6,523,918 B1 * | 2/2003 | Baiza ...................... 312/265.1 |
| 6,600,665 B2 * | 7/2003 | Lauchner .................... 361/826 |
| 6,715,718 B1 * | 4/2004 | Chen et al. ..................... 248/49 |
| 6,902,069 B2 * | 6/2005 | Hartman et al. ............... 211/26 |
| 6,945,504 B2 * | 9/2005 | Chen et al. ............... 248/282.1 |
| 7,023,708 B2 * | 4/2006 | Nguyen et al. .............. 361/810 |

* cited by examiner

*Primary Examiner*—Anita M King
(74) *Attorney, Agent, or Firm*—Knobbe, Martens, Olson & Bear, LLP

(57) ABSTRACT

A cable management device for managing cables extending between a support rack and an object slideable in and out of the support rack includes a support having a stop member and a mounting surface that is removably fastenable to the support rack. A first elongate member extends between a proximal end and a distal end and is pivotably fastened to the support at the proximal end. A second elongate member extends between a proximal end and a distal end, the proximal end of the second elongate member pivotably fastened to the distal end of the first elongate member. The first and second elongate members are movable from a folded position where the elongate members are substantially adjacent each other to an unfolded position, wherein the stop member limits the rotation of the first elongate member between the folded and unfolded positions to about ninety degrees.

33 Claims, 8 Drawing Sheets

RUGGED CABLE MANAGEMENT SYSTEM

CROSS-REFERENCE TO RELATED APPLICATIONS

This application claims priority to U.S. Provisional Application No. 60/663,488, titled "RUGGED CABLE MANAGEMENT SYSTEM" and filed Mar. 18, 2005, the entire contents of which are hereby incorporated by reference and should be considered a part of this specification.

BACKGROUND OF THE INVENTION

1. Field of the Invention

The present invention relates to cable management devices and, more particularly, to cable management devices for managing electrical cables extending from rack-mounted computer servers.

2. Description of the Related Art

For convenience and to conserve floor space, computer servers for high capacity computer systems are often mounted in rack structures. Typically, several computer servers are mounted in each server rack. Some types of businesses, for example, website service providers and online merchants, may have hundreds of computer servers mounted in dozens of different rack structures.

Each server rack generally includes a rectangular frame covered by removable panels in a pivotable front access door. Each server is typically supported within the server rack on a tray or chassis. The chassis is mounted on a pair of slides to allow the chassis to slide in and out of the server rack for convenient access to the server. Each slide is comprised of a stationary portion which is mounted to the frame of the server rack, and a telescoping portion which is mounted to the chassis. The telescoping portion is slideable with respect to the stationary portion to allow the chassis to slide in and out of the server rack for repair or replacement of the server.

To allow the server and chassis to slide in and out of the server rack, slack must be provided in the electrical cables leading to the server. Because several computer servers are typically stacked on top of one another in the server rack, the cables can hang down from one server to another. This can result in tangling of the cables as the servers are moved in and out of the server rack. If the cables leading to the server are tangled, it becomes difficult to slide the server in and out of the server rack to access the server. In addition, tangling of the cables may result in a cable being pulled out or unplugged from the server, possibly resulting in downtime of the server or loss of data.

To help alleviate this problem, cable management devices have been developed. These cable management devices typically include a support, usually made of metal or plastic, having one end attached to the server rack and one end attached to a rear surface of the computer server. The support is folded as the server is moved into the server rack, and unfolded as the server is moved out of the server rack. The cables leading to the server are attached to the support by separate tie straps so that the cables are folded and unfolded along with the support as the server slides in and out of the server rack. The tie straps are typically of the general purpose variety, and each tie straps extends around both the cables and the support.

While such cable management devices have served to reduce tangling of the electrical cables leading to the servers, they have proven inconvenient and time-consuming to install. In situations where reduction of downtime of the computer servers is critical, such as in Internet applications, the amount of time required to install cable management devices can be of great importance. This is especially true for very high capacity computer systems which comprise a large number of computer servers and thus require a large number of cable management devices. In addition, the tie straps of such cable management devices tend to slide along the length of the support and to gather at certain locations of the support, thereby causing unwanted slack in the cables.

In military applications, supporting mechanical structures (e.g., slides, brackets, cable management systems) generally need to be able to withstand harsh environmental conditions, such as shock and vibration due to explosions, as well as other extremes. Additionally, electronic boxes (e.g., servers, data storage units, etc) used in military applications are often smaller and more cost-effective, but have comparable computing performance and reliability of larger, more expensive systems. Accordingly, it is desirable for cable management devices used in military operations to be rugged and help protect electronic boxes mounted in a frame from shock and vibration by transferring such loads onto surrounding mechanical structures (e.g., rack frame) that are better suited to withstand such loads. Additionally, it is desirable to have cable management devices suitable for use with smaller electronic boxes.

Accordingly, there is a need for an improved cable management system that solves some of the problems discussed above.

SUMMARY OF THE INVENTION

It is a principal object of the present invention to provide an improved cable management device for managing electrical cables extending from a rack-mounted computer server.

In accordance with one aspect of the present invention, a cable management device for managing cables extending between an object and a support rack is provided, where the object is slideable at least partially in and out of the support rack. The cable management device comprises a support having a stop member and a mounting surface removably fastenable to the support rack. The cable management device also comprises a first elongate member extending between a proximal end and a distal end and pivotably fastened to the support at the proximal end. The cable management device also comprises a second elongate member extending between a proximal end and a distal end, the proximal end of the second elongate member pivotably fastened to the distal end of the first elongate member. The first and second elongate members are movable from a folded position where the elongate members are substantially adjacent to each other to an unfolded position. The stop member limits the rotation of the first elongate member between the folded position and the unfolded position to about ninety degrees.

In accordance with another aspect of the present invention, a cable management device for managing cables extending between an object and a support rack is provided, where the object is movable relative to the support rack. The cable management device comprises a mounting bracket removably fastenable to the support rack. The mounting bracket has a first post that extends therethrough and defines a first axis. The cable management device also comprises a first elongate member extending along a length between a proximal end and a distal end. The proximal end is fastened to the mounting bracket and is pivotable about the first axis. The first elongate member also has a first set of openings formed therethrough along its length. The cable management device also comprises a second elongate member extending along a length between a proximal end and a distal end. A proximal end of the second elongate member is pivotably fastened to the distal end of the first elongate member. The second elongate member also has a second set of openings formed therethrough along its length. The first and second elongate members are movable from a folded position substantially adjacent to each other when the object is moved into the support rack, to an extended position when the object is moved out of the support rack.

In accordance with another aspect of the present invention, a server management system is provided comprising a rack frame having front and rear portions, at least one server movably mounted on the rack frame, and at least one cable extending from the server toward a rear portion of the rack structure. The server management system also comprises a cable management device comprising a mounting bracket removably fastened to the rear portion of the rack frame, the mounting bracket having a stop member. The cable management device also comprises a first elongate member extending between the mounting bracket and a distal end, and is pivotably fastened to the mounting bracket. The cable management device also comprises a second elongate member extending between a proximal end pivotably fastened to the distal end of the first elongate member and a distal end. At least one of the first and second elongate members supports the at least one cable. The first and second elongate members are movable from a folded position substantially adjacent to each other when the server is moved toward the rear portion of the rack frame, to an extended position when the server is moved away from the rear portion of the rack frame. The stop member on the mounting bracket prevents the over-rotation of the first elongate member when in the folded position and prevents the over-extension of the first elongate member when in the extended position.

DETAILED DESCRIPTION OF THE PREFERRED EMBODIMENTS

Figure 1:
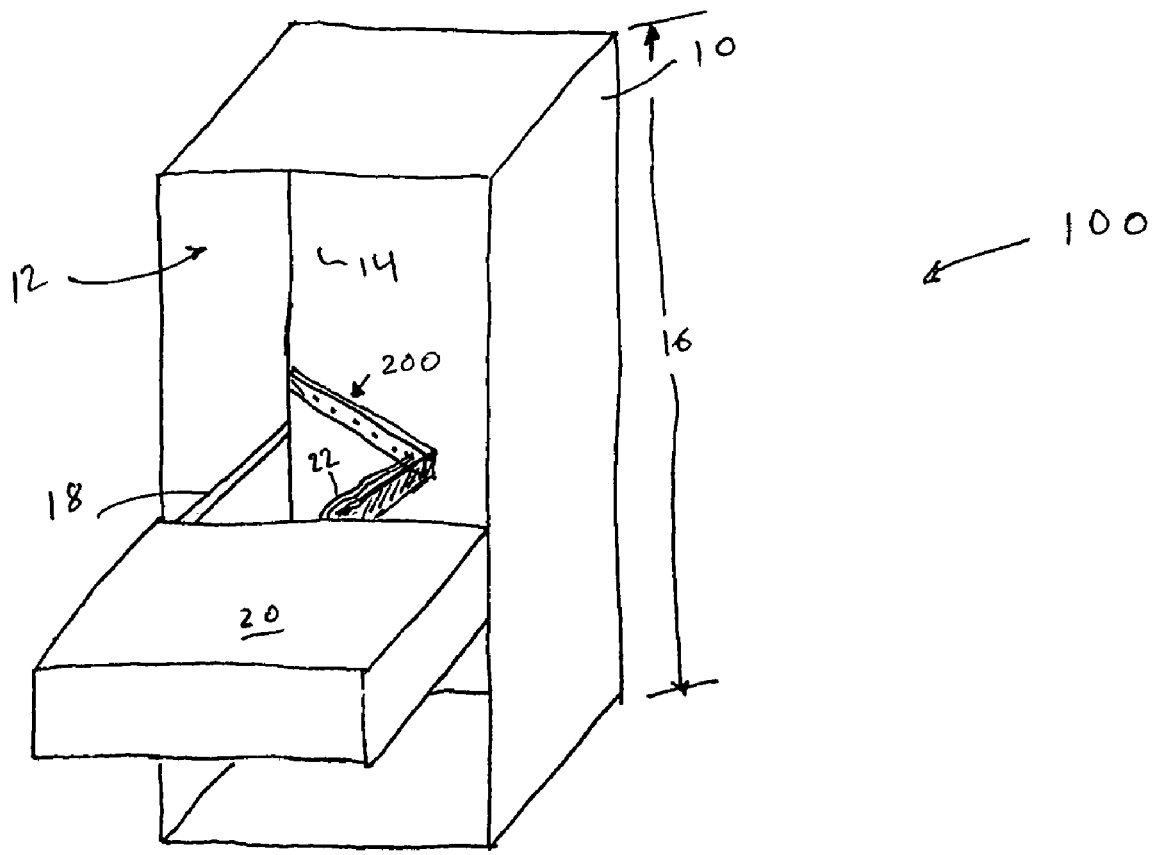
FIG. 1 is a perspective view of a server management system in accordance with one of the embodiments disclosed herein.
Figure 4:
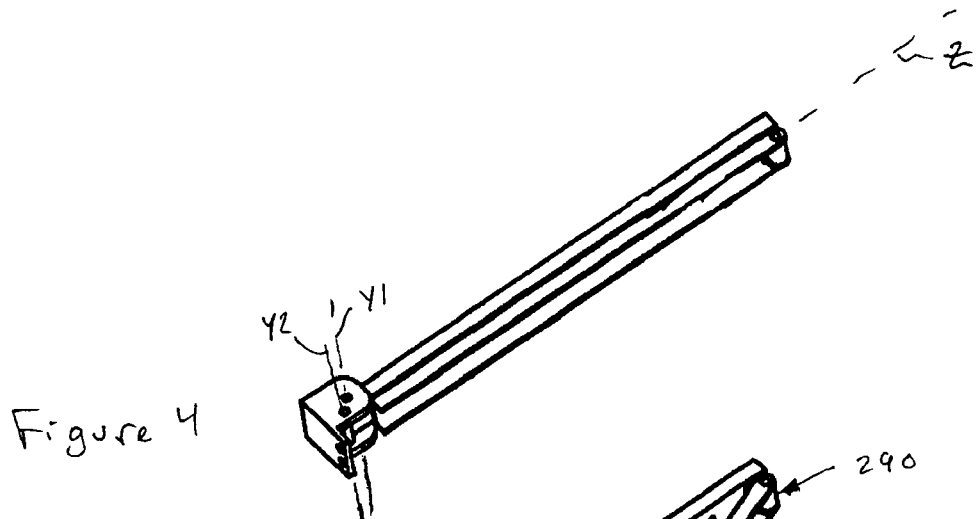
FIG. 4 is a perspective of the cable management device illustrated in FIG. 2 in a folded position.

FIG. 1 illustrates one embodiment of a server management system 100. The server management system 100 preferably includes a rack frame 10 having a front portion 12, a rear portion 14, and extending along a height 16. The rack frame 10 can have any suitable configuration. For example, in one embodiment, the rack frame 10 can include a plurality of rails fastened together so as to form the frame 10. In another embodiment the rack frame 10 can include a number of panels fastened together. In the illustrated embodiment, the server management system 100 preferably includes at least one server 20 moveably mounted on the rack frame 10. In one embodiment the server management system 100 comprises a plurality of servers 20 stacked on top of one another along the height 16 of the rack frame 10. Each of the servers 20 is movable in and out of the server rack 10 along at least one slide member 18. Additionally, each of the servers 20 preferably has at least one cable 22 extending from a rear portion of the server 20 toward the rear portion 14 of the rack frame 10. A cable management device 200 disposed between the rear portion 14 of the rack frame 10 and the rear portion of the server 20 preferably maintains the at least one cable 22 in an ordered configuration, as discussed further below.

FIGS. 2-7 illustrate one embodiment of a cable management device or device 200 used for managing cables extending between two objects, wherein at least one of the objects is movable relative to the other object. For example, the cable management device 200 can be used to manage cables 22 extending between at least one server 20 and the rack frame 10 discussed above.

The cable management device 200 comprises a support for moveably attaching the cable management device 200 to the rack frame 10. In the illustrated embodiment, the support is a mounting bracket 210 having a mounting surface 212 that can be fastened to the rear portion 14 of the rack frame 10, as further discussed below. The mounting surface 212 can be fastened to the rear portion of the rack frame via, for example, bolts, screws, welds, or adhesives. In the illustrated embodiment, the mounting bracket 210 defines two bores 220 through the mounting surface 212 that can receive fasteners, such as bolts, therethrough to fasten the cable management device 200 to the rack frame 10. Preferably, the mounting bracket 210 is fastened to the rear portion 14 of the rack frame 10 so that the cable management device 200 extends generally horizontally relative to the height 16 of the rack frame 10. In one embodiment, the mounting surface 212 of the mounting bracket 210 can be fastened to the left side of the rear portion 14 of the rack frame 10. In another embodiment, the mounting surface 212 of the mounting bracket 210 can be fastened to the right side of the rear portion 14 of the rack frame 10. Further discussion of the mounting of the mounting bracket 210 to the rack frame 10 is provided below.

Figure 6:
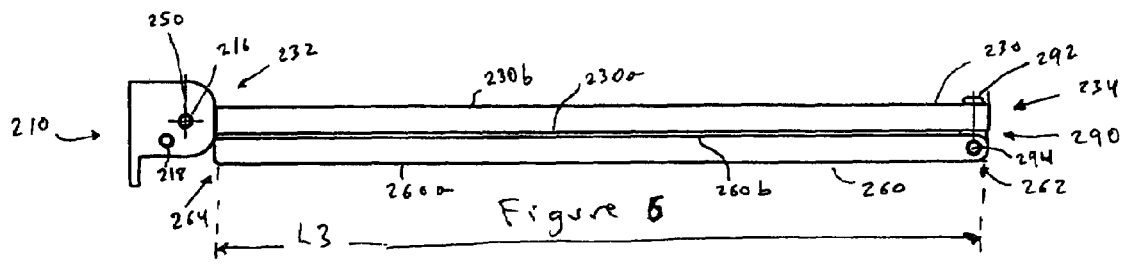
FIG. 6 is a top view of the cable management device illustrated in FIG. 2 in the folded position.
Figure 5:
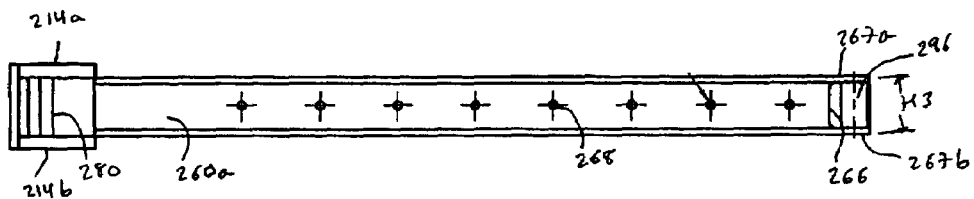
FIG. 5 is a front view of the cable management device illustrated in FIG. 2.

As illustrated in FIG. 5, the mounting bracket 210 has a first wall 214a and a second wall 214b extending from the mounting surface 212. Preferably, the first and second walls 214a, 214b are generally parallel to each other. The mounting bracket 210 also has first apertures 216 formed on the first and second walls 214a, 214b. Preferably, the first apertures 216 align with each other along an axis Y1 generally parallel to the mounting surface 212. The mounting bracket 210 also has second apertures 218 formed on the first and second walls 214a, 214b, where the second apertures 218 preferably align along a second axis Y2 generally parallel to the first axis Y1. As illustrated in FIG. 6, the second apertures 218 are disposed along the first and second walls 214a, 214b at a location that is offset from the position of the first apertures 216. Specifically, the second apertures 218 are disposed between the location of the first apertures 216 and the mounting surface 212. In the illustrated embodiment, the first and second apertures 216, 218 have generally the same diameter. In another embodiment, the diameter of the first apertures 216 can differ from the diameter of the second apertures 218. In one embodiment, when the mounting bracket 210 is fastened to the rear portion 14 of the rack frame 10, the first axis Y1 is preferably generally parallel to the height 16 of the rack frame 10.

The cable management device 200 also comprises a first elongate member 230 extending between a proximal 232 and a distal end 234. As illustrated in FIG. 6, the proximal end 232 of the first elongate member 230 is pivotably fastened to the mounting bracket 210 about the first axis Y1. In one embodiment, the proximal end 232 of the first elongate member 230 can be pivotably fastened to the mounting bracket 210 via a post 250 extending through the first apertures 216 and through a hole 236 at the proximal end 232 of the first elongate member 230. In another embodiment, other mechanisms can be used for fastening the proximal end 232 of the first elongate member 230 to the mounting bracket 210, such as a hinge. The first elongate member 230 has a front surface 230a and a rear surface 230b opposite each other and defines a first set of openings 238 along a length L2 of the first elongate member 230, as illustrated in FIG. 6. In one embodiment, the first elongate member 230 has a length L2 of between about 13 inches and about 16 inches. More preferably, the first elongate member 230 has a length L2 of between about 15.1 inches and about 15.8 inches. However, one of ordinary skill in the art will recognize that the first elongate member 230 can have any suitable length L2. Preferably, the first elongate member 230 has a width W2 between the front and rear surfaces 230a, 230b of between about 0.5 inches and about 0.75 inches. In another embodiment, the first elongate member 230 has a width W2 of about 0.6 inches. However, one of ordinary skill in the art will recognize that the first elongate member 230 can have any other suitable widths W2. Additionally, the first elongate member 230 preferably has a height H2 of about 1 U. In another embodiment, the first elongate member 230 can have a height H2 of about 2 U. As used herein, the term "U" refers to a unit of measurement commonly known in the art and equal to 1.75 inches.

The cable management device 200 also comprises a second elongate member 260 extending from a proximal end 262 to a distal end 264. As illustrated in FIG. 6, the proximal end 262 of the second elongate member 260 is pivotably attached to the distal end 234 of the first elongate member 230, and the distal end 264 of the second elongate member 260 is preferably a free end. In one embodiment, the second elongate member 260 has a length L3 of between about 15 inches and about 13 inches. In another embodiment, the second elongate member 260 has a length L3 of about 15.1 inches. Preferably, the second elongate member 260 has a length L3 shorter than the length L2 of the first elongate member 230. As illustrated in FIG. 5 and FIG. 6, the second elongate member 260 has a front surface 260a and a rear surface 260b opposite each other, wherein the rear surface 260b of the second elongate member 260 is generally adjacent the front surface 230a of the first elongate member 230 when the cable management device 200 is in the folded position, as illustrated FIG. 6. A second set of openings 268 extend through a width W3 of the second elongate member 260, from the front surface 260a to the rear surface 260b, and along at least a portion of the length L3, as illustrated in FIG. 5. In one embodiment, the second elongate member 260 has the same height H2 as the first elongate member 230. In another embodiment, the second elongate member 260 can have a height H3 of about 1U. In another preferred embodiment, the second elongate member 260 can have a height H3 of about 2U. In one embodiment, the front and rear surfaces 260a, 260b of the second elongate member 260 are generally flat. In another embodiment, at least one of the front and rear surfaces 260a, 260b of the second elongate member 260 can be recessed so as to provide a C-shaped cross-section. One of ordinary skill in the art will recognize that the cross-section of the second elongate member 260 can have other shapes, such as U or I. Additionally, the second elongate member 260 preferably has a recessed edge 266 at the proximal end 262 defining a first extension member 267a and a second extension member 267b generally parallel to each other.

The first elongate member 230 and the second elongate member 260 are preferably pivotably connected to each other by a connecting member 290. The connecting member 290 can fastened to the distal end 234 of the first elongate member 230 by at least one fastener 292. In the illustrated embodiment, as shown in FIG. 6, the connecting member 290 is fastened to the distal end 234 of the first elongate member 230 by a pair of screws 292. However, the connecting member 290 can be fastened to the first elongate member 230 via other suitable mechanisms, such as bolts, welds, or adhesives. The connecting member 290 pivotably fastens to the proximal end 262 of the second elongate member 260 about a post 294 extending through the first and second extension members 267a, 267b and through a bushing 296. In another embodiment, the connecting member 290 can be a hinge pivotably connecting the distal end 234 of the first elongate member 230 to the proximal end 262 of the second elongate member 260.

As discussed above, the first elongate member 230 is pivotably mounted to the mounting bracket 210. In a preferred embodiment the first elongate member 230 is pivotable between a folded position (see FIG. 4) wherein the length L2 of the first elongate member 230 extends along an axis Z generally perpendicular to the mounting surface 212, to an extended position wherein the length L2 of the first elongate member 230 extends generally parallel to the mounting surface 212 of the mounting bracket 210. In one embodiment, the rotation of the first elongate member 230 from the folded position to the extended position is limited to about 90°. In another embodiment, the rotation of the elongate member from the folded position to the extended position is limited to between about 85° and about 100°. Preferably, a post 280 extending through the second apertures 218 on the walls 214a, 214b of the mounting bracket 210 limits the rotation of the first elongate member 230 between the folded position and the extended position. For example, when in the folded position the stop member 280 preferably prevents the over-rotation of the first elongate member 230 past the location generally perpendicular to the mounting surface 212. Likewise, the stop member 280 preferably prevents the overextension of the first elongate member 230 when moved into the extended position, so that the first elongate member 230 does not extend past the location generally parallel to the mounting surface 212.

Figure 3:
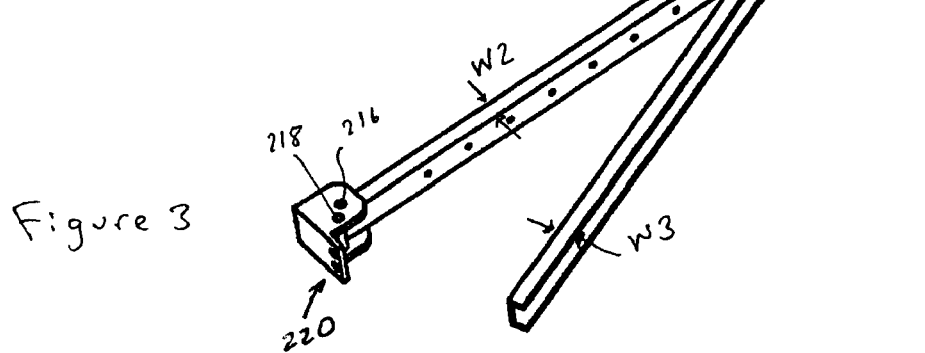
FIG. 3 is a perspective view of the cable management device shown in FIG. 2 in a second extended position.
Figure 2:
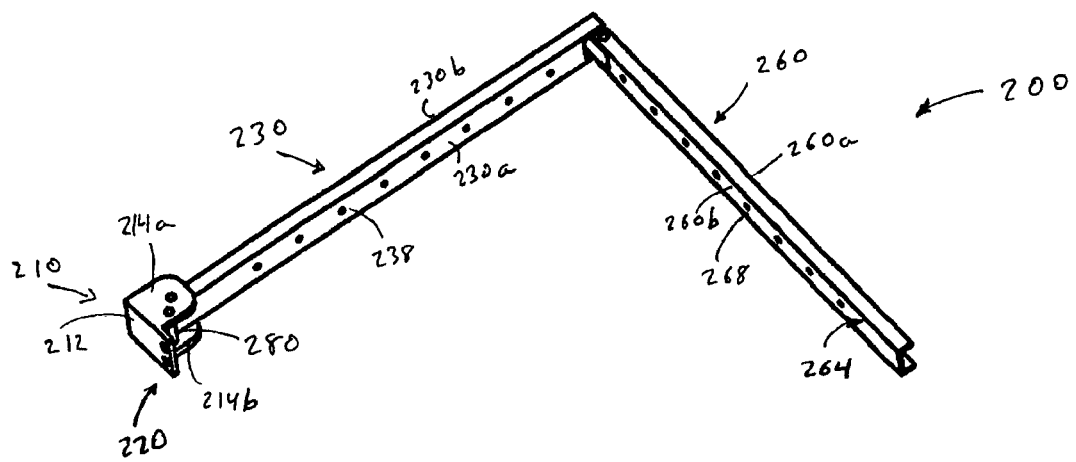
FIG. 2 is a perspective view of one embodiment of a cable management device in one extended position.
Figure 7:
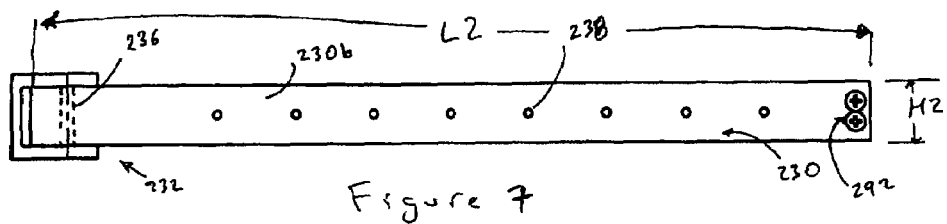
FIG. 7 is a rear view of the cable management device illustrated in FIG. 2.

In the folded position, as illustrated in FIG. 6, the second elongate member 260 is generally adjacent to the first elongate member 230, wherein both elongate members 230, 260 extend generally perpendicular to the mounting surface 212. As the cable management device 200 is unfolded, the first and second elongate members 230, 260 pivot away from each other When unfolded into the fully extended position, the second elongate member 260 extends generally parallel to the first elongate member 230. In another embodiment, the second elongate member 260 extends generally at an angle to the first elongate member 230 when in the extended position, as shown in FIGS. 2 and 3. In one embodiment, the second elongate member 260 extends at an acute angle relative to the first elongate member 230 when in the extended position. In another embodiment, the second elongate member 260 extends at an obtuse angle relative to the first elongate member 230 when in the fully extended position.

In a preferred embodiment, the cable management device 200 is made up of metal or metal alloy. In one preferred embodiment, the cable management device 200 is made of aluminum. In another embodiment, the cable management device 200 can be made of stainless steel. Accordingly, in a preferred embodiment, the cable management device 200 has a rugged configuration. However, one of ordinary skill in the art will recognize that the cable management device 200 according to the embodiments disclosed herein can be made of any other suitable lightweight and high-strength materials. Preferably, the cable management device 200 is made up of material having a modulus of elasticity of between about 50,000 MPa (50 GPa) and about 100,000 MPa (100 GPa), and more preferably between about 70,000 MPa (70 GPa) and about 75,000 MPa (75 GPa). Further, in a preferred embodiment, the cable management device 200 has a tensile strength at break of between about 300 MPa and about 2000 MPa, and more preferably between about 300 MPa and about 600 MPa.

Figure 8A:
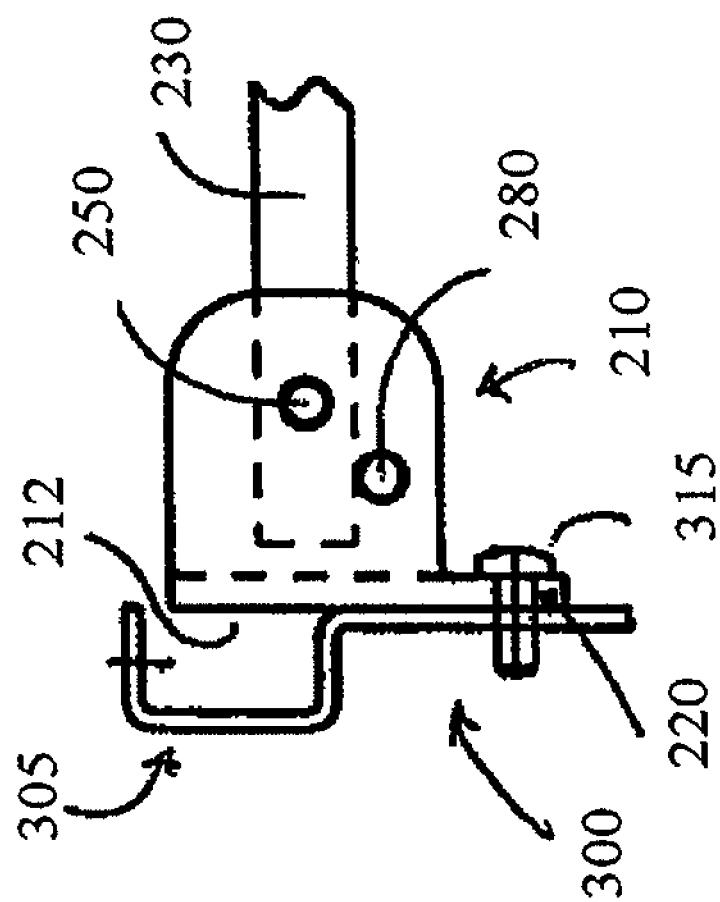
FIG. 8a is a partial side view of the mounting bracket of the cable management device of FIG. 2 in a mounting position.
Figure 8B:
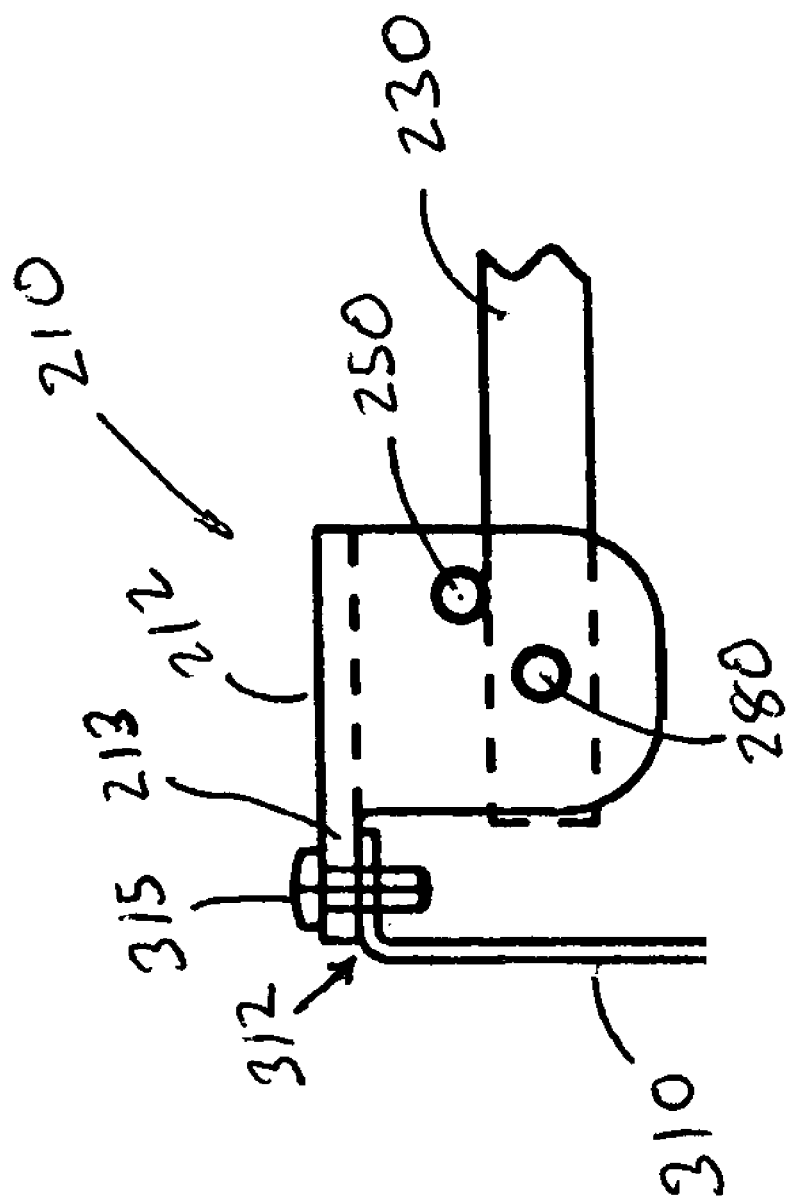
FIG. 8b is a partial side view of the mounting bracket of the cable management device of FIG. 2 in another mounting position.

In use, the cable management device 200 can be attached to the rear portion 14 of the rack frame 10. FIGS. 8a and 8b illustrate two different mounting configurations for the cable management device 200.

In accordance with FIG. 8a, the mounting bracket 210 is mounted to a sidewall 300 of a vertical rail 305 of the rack frame 10 via bolts 315 that extend through the bores 220 in the bracket 210. In the illustrated embodiment, as least a portion of the surface 212 of the bracket 210 is in contact with the sidewall 300. As discussed above, the first elongate member 230 is pivotably fastened to the mounting bracket 210 via the post 250 that extends through the first elongate member 230 and the first and second walls 214a, 214b of the mounting bracket 210. Additionally, as discussed above, post 280 also extends through the walls 214a, 214b of the mounting bracket 210 and acts as a stop member to limit the rotation of the first elongate member 230 between the folded position and fully extended position.

FIG. 8b shows another embodiment for mounting the cable management device 200. In the illustrated embodiment, the mounting bracket 210 is mounted to a standard rail 310 of the rack frame 10. Specifically, a flange 213 of the mounting bracket 210 is fastened to a flanged end 312 of the rail 310 via bolts 315 extending through the bores 220. However, in the illustrated embodiment, the first elongate member 230 is pivotably fastened to the mounting bracket 210 via the post 280 and the post 250 acts as a stop member to limit the rotation of the first elongate member 230 between a folded and an extended position relative to the bracket 210. In the folded position, the illustrated embodiment of the cable management device 200 would have the first elongate member 230 extending generally parallel to the mounting surface 212 of the mounting bracket 210. As the cable management device 200 is unfolded from the folded position, the first elongate member 230 in FIG. 8b rotates clockwise until it reaches a fully extended position where the first elongate member 230 extends generally perpendicular to the mounting surface 212 of the mounting bracket 210. Accordingly the cable management device 200 can be mounted to the rack frame 10 in a variety of configurations.

Figure 9:
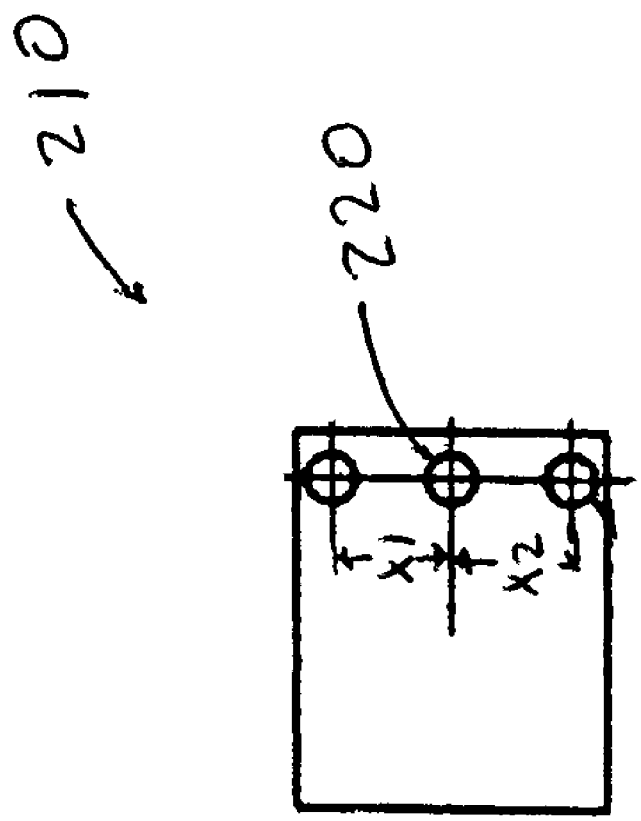
FIG. 9 is an end view of the mounting bracket of another embodiment of a cable management device.

As shown in FIG. 2, in one embodiment the mounting bracket 210 has two bores 220 extending through the flanged portion 213. However, in other embodiments, the mounting bracket can have more or less than two bores. For example, as shown in FIG. 9, the mounting bracket 210 can have three bores 220 formed therein, at least two of which can be used to fasten the cable management device 200 to the rack frame 10. In one embodiment, all of the bores 220 are spaced equidistantly from each other so that a distance X1 between the first and second bores 220 is equal to a distance X2 between the second and third bores. For example, all of the bores can be spaced approximately ⅝ inch from each other. In another embodiment, the distance X1 between the first and second bores differs from the distance X2 between the second and third bores. The bore spacing advantageously allows the mounting bracket 210 to be mounted to rails with equidistant mounting bores, as well as to rails with non-equidistant mounting bores formed therein.

The cables 22 extending from the rear of the server 20 preferably are passed through the first and second set of openings 238, 268 in the first and second elongate members 230, 260, respectively, so that each one of the cables 22 passes through one of the first openings 238 and corresponding one of the second openings 268. When the server 20 is moved toward the rear portion 14 of the rack frame 10, the cable management device 200 moves toward the folded position, wherein the first and second elongate members 230, 260 are positioned adjacent each other, as discussed above. As the server 20 is moved away from the rear portion of the rack frame 10, the first and second elongate members 230, 260 move into the unfolded or extended position wherein the second elongate member 260 pivots away from the first elongate member 230 as the first elongate member 230 pivots about its proximal end 232. In the fully extended position, the first elongate member 230 extends generally parallel to the mounting surface 212 of the mounting bracket 210, and the second elongate member 260 extends away from the first elongate member 230.

As discussed above, in one embodiment, the second elongate member 260 extends at an obtuse angle relative to the first elongate member 230 when in the fully extended position. In one embodiment, the obtuse angle is in a range of between about 181° and about 190°. More preferably, the obtuse angle is about 185°. Preferably, when the server 20 moves toward the rear portion 14 of the rack frame 10, so that the first and second elongate members 230, 260 move into the folded position, the first elongate member 230 does not rotate past the location generally perpendicular to the mounting surface 212. As discussed above, the stop member 280 extending through the second apertures 218 in the mounting bracket 210 bumps up against the proximal end 232 of the first elongate member 230 as the first elongate member 230 reaches said generally perpendicular position relative to the mounting surface 212. Accordingly, the stop member 280 substantially prevents the first elongate member 230 from over-rotating past said generally perpendicular position when moved into the folded position. Likewise, the stop member 280 substantially prevents the rotation of the first elongate member 230 past a position generally parallel to the mounting surface 212 when moved into the fully extended or unfolded position. The fully extended or unfolded position is attained as the server 20 is withdrawn from the rack frame 10 and moved away from the rear portion 14 of the rack frame 10.

Although the embodiment illustrated at FIGS. 2-7 illustrates the stop member 280 as a post extending from the first wall 214a to the second wall 214b of the mounting bracket 210, one of ordinary skill in the art will recognize that the stop member 280 can extend a portion of the distance between the first and second walls 214a, 214b. In another embodiment, the stop member 280 can have other configurations, such as protrusions extending from the first and second walls 214a, 214b, such protrusions configured to contact the first elongate member 230 when it is rotated into the fully extended position or into the folded position. In another embodiment, the stop member 280 can be a wall extending from the mounting surface 212 of the mounting bracket 210 to a location between the mounting surface 212 and the location of the first apertures 216 on the first and second wall 214a, 214b, such that the wall prevents the over-rotation of the first elongate member 230 when moved into the folded position or the fully extended position, as discussed above.

In the embodiment illustrated in FIGS. 2-7 above, the cable management device 200 has two elongate members 230, 260. However, one of ordinary skill in the art will recognize that the cable management device 200 can have a third elongate member wherein the proximal end of the third elongate member is pivotably connected to the distal end of the second elongate member 260 and a distal end of the third elongate member is a free end. Moreover, the cable management system can have any number of elongate members pivotably attached to each other, at least one of the elongate members pivotably attached to the mounting bracket 210, wherein the mounting bracket 210 is fastened to the rear portion 14 of the rack frame 10.

Figure 10:
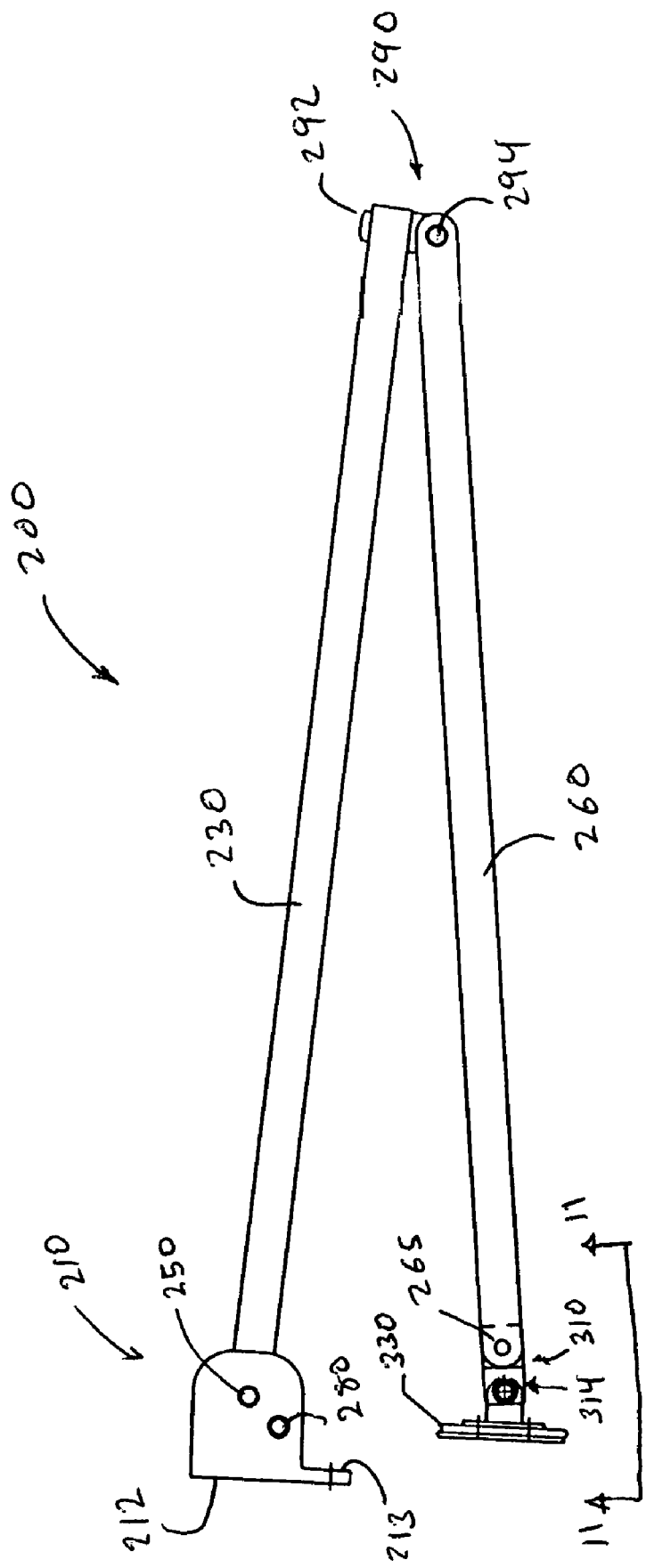
FIG. 10 is a side view of the cable management device of FIG. 2 coupled to a slide.
Figure 11:
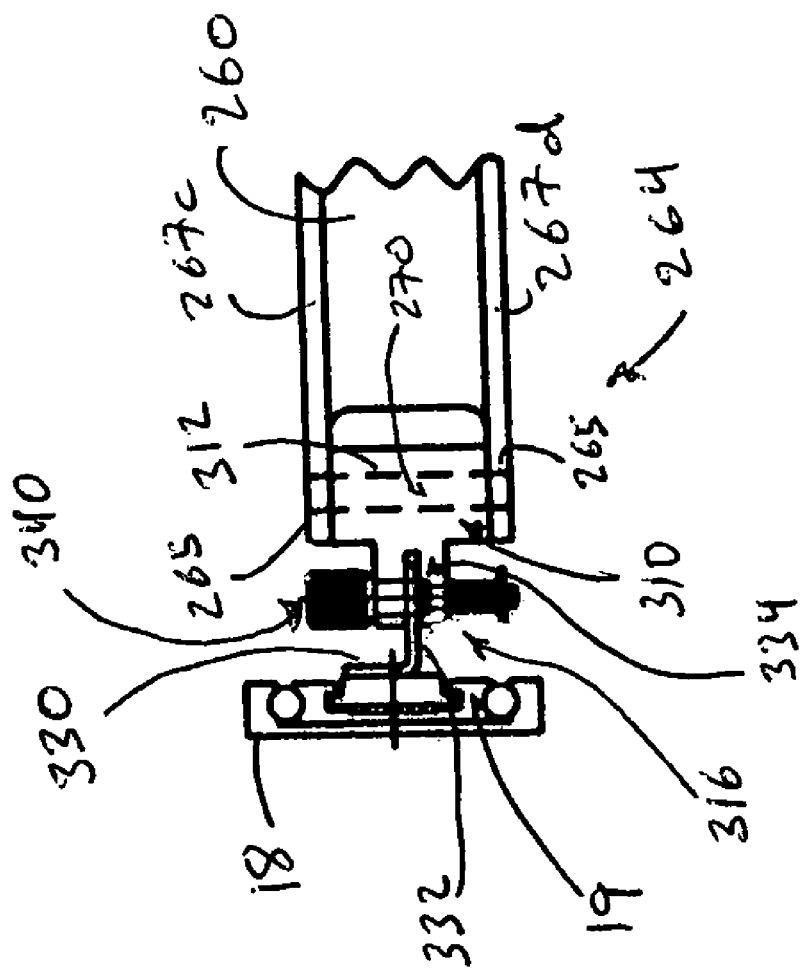
FIG. 11 is a partial front view of a distal end of an elongate member of the cable management device coupled to a slide.

In another embodiment, the distal end 264 of the second elongate member 260 can be slidingly mounted to the rack frame 10. For example, the distal end 264 of the second elongate member 260 can be fastened to the slide 18. As shown in FIGS. 10 and 11, the second elongate member 260 can have two bores 265 formed proximal the distal end 264 thereof, wherein the bores 265 extend along a common axis through side walls 267c, 267d of the second elongate member 260. An extension member 310 defining a bore 312 therethrough can be fastened to the distal end 264 of the second elongate member 260. As shown in FIG. 11, the extension member 310 is preferably positioned between the side walls 267c, 267d so that the bore 312 aligns with the bores 265 in the second elongate member 260. A fastener 270 is then inserted through the bores 265, 264 to fasten the extension member 310 and second elongate member 260. Any suitable fastener can be used, such as a screw, a bolt, and a pin.

The extension member 310 also defines a second bore 314 therethrough proximal a distal end 316 of the member 310. The extension member 310 preferably couples to a bracket 330 disposed in the slide 18 via a fastener 340. The bracket 330 is preferably positioned in a channel 19 of the slide 18 and includes a flanged portion 332 defining a bore 334 therein.

As noted above, the extension member 310 removably fastens to the bracket 330 via a fastener 340. In a preferred embodiment, the fastener 340 is spring-loaded, so it can be actuated to couple the extension member 310 and bracket 330 with minimal effort. For example, the fastener 340 can preferably be pulled in a direction generally perpendicular to the length of the second elongate member 260 to allow the bores 314, 334 on the extension member 310 and bracket 330 to align with each other. Once the bores 314, 334 are aligned, the fastener 340 can be released so that it extends through the bores 314, 334, thus coupling the extension member 310 to the bracket 330. Accordingly, the fastener 340 preferably allows for the extension member 310 and bracket 330 to be readily coupled and decoupled. In another embodiment, the fastener 340 is not spring-loaded, but is manually inserted through the bores 314, 334 to couple the extension member 310 to the bracket 330. For example, the fastener 340 can be a threaded screw that threadingly engages corresponding threads on the bores 314, 334. Advantageously, the second elongate member 260 can be uncoupled from the slide 18 by removing the fastener 340 from engagement with the extension member 310 and bracket 330, thus releasing the second elongate member 260 from engagement with the bracket 330.

The fastener 340 can be a screw, a releasable pin, a bolt, or any suitable fastener that allows for the easy coupling and decoupling of the second elongate member 260 and the bracket 330.

In a preferred embodiment, the bracket 330 is fixed to the slide 18 so that the bracket moves along with the slide 18 when the slide 18 moves within an outer slide movably coupled therewith. In another embodiment, the bracket 330 is movable within the channel 19 of the slide 18. Accordingly, as the server 20 is moved along the slide 18 in and out of the rack frame 10, the second elongate member 260 moves along with the slide 18, moving the cable management device 200 from the folded position to the extended position as discussed above. The distal end 264 of the second elongate member 260 can be fastened to the slide via an adapter that slidingly moves within the slide. In another embodiment, the adapter can slidingly move about the slide.

The devices and systems described above provide a number of ways to carry out the invention. Of course, it is to be understood that not necessarily all objectives or advantages described may be achieved in accordance with any particular embodiment described herein. Also, although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited to the specific disclosures of preferred embodiments herein.

What is claimed is:

1. A cable management device for managing cables extending between an object and a support rack, the object being slideable at least partially in and out of the support rack, the device comprising:

a support comprising a pair of opposite walls extending from a mounting surface, the support removably attachable to the support rack via a flange defined by the mounting surface and extending generally perpendicular to the pair of opposite walls, the support having a stop member extending between the pair of opposite walls along a first axis;

a first elongate member extending between a proximal end and a distal end and pivotably fastened to the support at the proximal end along a second axis between the pair of opposite walls, the second axis offset from the first axis; and a second elongate member extending between a proximal end and a distal end, the proximal end of the second elongate member pivotably fastened to the distal end of the first elongate member, wherein the first and second elongate members are movable from a folded position where the elongate members are substantially adjacent each other to an unfolded position, the stop member limiting the rotation of the first elongate member between the folded and unfolded positions to about ninety degrees.

2. The cable management device of claim 1, wherein a height of the first and second elongate members is approximately 1 U.

3. The cable management device of claim 1, wherein a height of the first and second elongate members is approximately 2 U.

4. The cable management device of claim 1, wherein the first and second elongate members have a strength of between about 300 MPa and about 2000 MPa.

5. The cable management device of claim 1, wherein the first and second elongate members have a modulus of elasticity of between about 50 GPa and about 75 GPa.

6. The cable management device of claim 1, wherein the first elongate member in the folded position extends generally perpendicular to the mounting surface.

7. The cable management device of claim 1, wherein the first elongate member in the unfolded position extends generally parallel to the mounting surface.

8. The cable management device of claim 1, further comprising a third elongate member extending between a proximal end and a distal end, the proximal end of the third elongate member pivotably fastened to the distal end of the second elongate member.

9. The cable management device of claim 1, wherein the distal end of the second elongate member is movably fastened to a slide in the support rack.

10. The cable management device of claim 9, wherein the distal end of the second elongate member is releasably coupleable to the slide.

11. The cable management device of claim 1, wherein the stop member is a post.

12. The cable management device of claim 1, wherein the first and second elongate members have a low profile in cross-section when in the folded position.

13. The cable management device of claim 12, wherein the first and second elongate members have a combined thickness of no more than about 1.1 inch in the folded position.

14. The cable management device of claim 1, wherein in the unfolded position the second elongate member is fully extended generally parallel to the first elongate member.

15. The cable management device of claim 1, wherein in the unfolded position the second elongate member extends at an acute angle relative to the first elongate member.

16. The cable management device of claim 1, wherein the support is mounted to the support rack so that at least a portion of the mounting surface is in contact with a vertical slide of the support rack.

17. The cable management device of claim 1, wherein the support is mounted to the support rack so that a flange of the support is in contact with a flange of a rail of the support rack.

18. The cable management device of claim 1, wherein the support is removably fastenable to the support rack via at least one fastener extending through a corresponding bore in the support.

19. The cable management device of claim 18, wherein the support includes three bores configured to receive fasteners therethrough to fasten the support the support rack.

20. A cable management device for managing cables extending between an object and a support rack, the objects being movable relative to the support rack, the device comprising:
a mounting bracket removably fastenable to the support rack, the mounting bracket having a post extending between a pair of opposite walls of the mounting bracket defining a first axis;
a first elongate member extending along a length between a proximal end and a distal end, the proximal end fastened to the mounting bracket and pivotable about a second axis offset from the first axis, the first elongate member having a first set of openings formed therethrough along its length; and
a second elongate member extending along a length between a proximal end and a distal end, the proximal end of the second elongate member pivotably fastened to the distal end of the first elongate member, the second elongate member having a second set of openings formed therethrough along its length,
wherein the first and second elongate members are movable from a folded position substantially adjacent each other when the object is moved into the support rack to an unfolded position when the object is moved out of the support rack, the post configured to limit the range of rotation of the first elongate member to between about 85 degrees and about 110 degrees.

21. The cable management device of claim 20 wherein a height of the first and second elongate members is approximately 1 U.

22. The cable management device of claim 20, wherein a height of the first and second elongate members is approximately 2 U.

23. The cable management device of claim 20, wherein the first and second elongate members have a strength of between about 300 MPa and about 600 MPa.

24. The cable management device of claim 20, wherein the first and second elongate members have a modulus of elasticity of between about 70 GPa and about 75 GPa.

25. The cable management device of claim 20, wherein a thickness of the device when in the folded position is no more than about 1.1 inch.

26. The cable management device of claim 20, wherein the at least one opening is configured to receive a cable therethrough.

27. The cable management device of claim 20, wherein the first and second elongate members are made of aluminum.

28. In combination with a server management system having a rack frame with a front portion and a rear portion, at least one server movably mounted on the rack frame, and at least one cable extending from the server toward the rear portion of the rack frame, a cable management device comprising:
a mounting bracket removably fastened to the rear portion of the rack frame, the mounting bracket having a stop member extending between opposite walls of the mounting bracket;
a first elongate member extending between the mounting bracket and a distal end, and pivotably fastened to the mounting bracket between the pair of opposite walls and about an axis offset from the stop member; and
a second elongate member extending between a proximal end pivotably fastened to the distal end of the first elongate member and a distal end, at least one of the first and second elongate members supporting the at least one cable,
wherein the first and second elongate members are movable from a folded position substantially adjacent each other when the server is moved toward the rear portion of the rack frame, to an extended position when the server is moved away from the rear portion of the rack frame, and wherein the stop member prevents the over-rotation of the first elongate member when in the folded position and prevents the over-extension of the first elongate member when in the extended position.

29. The cable management device of claim 28, wherein a height of the first and second elongate members is approximately 1 U.

30. The cable management device of claim 28, wherein a height of the first and second elongate members is approximately 2 U.

31. The cable management device of claim 28, wherein the first and second elongate members are made of a light weight, high strength metal alloy.

32. The cable management device of claim 28, wherein in the extended position the second elongate member is fully extended generally parallel to the first elongate member.

33. The cable management device of claim 28, wherein in the extended position the second elongate member extends at an acute angle relative to the first elongate member.

* * * * *

UNITED STATES PATENT AND TRADEMARK OFFICE
CERTIFICATE OF CORRECTION

PATENT NO. : 7,451,957 B2  Page 1 of 1
APPLICATION NO. : 11/386030
DATED : November 18, 2008
INVENTOR(S) : Bao Nguyen It is certified that error appears in the above-identified patent and that said Letters Patent is hereby corrected as shown below:

At column 11, line 43, before "rack", please delete "the support".

Signed and Sealed this

Eighteenth Day of August, 2009

David J. Kappos
*Director of the United States Patent and Trademark Office*